United States Patent
Liao et al.

(10) Patent No.: US 9,276,057 B2
(45) Date of Patent: Mar. 1, 2016

(54) CAPACITOR STRUCTURE AND METHOD OF MANUFACTURING THE SAME

(71) Applicant: UNITED MICROELECTRONICS CORP., Hsin-Chu (TW)

(72) Inventors: Duan Quan Liao, Singapore (SG); Yikun Chen, Singapore (SG); Ching Hwa Tey, Singapore (SG); Xiao Zhong Zhu, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/165,535

(22) Filed: Jan. 27, 2014

(65) Prior Publication Data

US 2015/0214293 A1   Jul. 30, 2015

(51) Int. Cl.
| | |
|---|---|
| H01L 29/94 | (2006.01) |
| H01L 49/02 | (2006.01) |
| H01L 21/768 | (2006.01) |
| H01L 23/522 | (2006.01) |
| H01L 23/532 | (2006.01) |
| H01L 27/108 | (2006.01) |

(52) U.S. Cl.
CPC .......... *H01L 28/75* (2013.01); *H01L 21/76807* (2013.01); *H01L 23/5223* (2013.01); *H01L 23/5329* (2013.01); *H01L 23/53238* (2013.01); *H01L 23/53295* (2013.01); *H01L 27/10852* (2013.01); *H01L 28/91* (2013.01); *H01L 27/10808* (2013.01)

(58) Field of Classification Search
CPC .............. H01L 28/75; H01L 21/76807; H01L 2221/1015; H01L 2221/1031; H01L 2221/1036; H01L 27/10852; H01L 27/10808; H01L 28/91; H01L 29/945
See application file for complete search history.

(56) References Cited

U.S. PATENT DOCUMENTS

| | | | | |
|---|---|---|---|---|
| 6,081,021 A * | 6/2000 | Gambino et al. | ............. | 257/530 |
| 6,624,018 B1 * | 9/2003 | Yu et al. | ......... | 438/239 |
| 2002/0182857 A1 * | 12/2002 | Liu et al. | ........ | 438/645 |
| 2003/0060052 A1 * | 3/2003 | Kim et al. | ........ | 438/694 |
| 2003/0073279 A1 * | 4/2003 | Chiang | ........ | 438/239 |
| 2003/0102522 A1 * | 6/2003 | Lee | ...... | 257/532 |
| 2003/0129805 A1 * | 7/2003 | Kim | ........ | 438/386 |
| 2003/0186535 A1 * | 10/2003 | Wong et al. | ........ | 438/637 |
| 2003/0214043 A1 * | 11/2003 | Saitoh et al. | ........ | 257/758 |
| 2004/0051131 A1 * | 3/2004 | Miyajima | ........ | 257/306 |
| 2004/0077143 A1 * | 4/2004 | Lee et al. | ........ | 438/253 |
| 2004/0163233 A1 * | 8/2004 | Gernhardt et al. | ........ | 29/602.1 |
| 2005/0121787 A1 * | 6/2005 | Uchida | ........ | 257/751 |
| 2006/0145293 A1 * | 7/2006 | Cho | ........ | 257/532 |
| 2006/0199330 A1 * | 9/2006 | Nakamura et al. | ........ | 438/253 |

(Continued)

OTHER PUBLICATIONS

Brain, A 22nm High Performance Embedded DRAM SoC Technology Featuring Tri-gate Transistors and MIMCAP COB, Jun. 11, 2013.

(Continued)

*Primary Examiner* — Matthew Landau
*Assistant Examiner* — Grant Withers
(74) *Attorney, Agent, or Firm* — Winston Hsu; Scott Margo

(57) ABSTRACT

A capacitor structure includes a substrate with a plurality of dielectric layers sequentially formed thereon, a trench formed in the dielectric layers, wherein the trench is composed of at least two interconnected dual damascene recesses, each dual damascene recess formed in one dielectric layer; and a capacitor multilayer disposed on the sidewall of the trench.

12 Claims, 4 Drawing Sheets

(56) References Cited

U.S. PATENT DOCUMENTS

| | | | |
|---|---|---|---|
| 2006/0214265 A1* | 9/2006 | Goebel et al. | 257/533 |
| 2006/0234443 A1* | 10/2006 | Yang et al. | 438/253 |
| 2007/0063240 A1* | 3/2007 | Torres et al. | 257/296 |
| 2007/0080382 A1* | 4/2007 | Kikuchi et al. | 257/295 |
| 2007/0152258 A1* | 7/2007 | Kim | 257/309 |
| 2007/0155091 A1* | 7/2007 | Park | 438/253 |
| 2007/0164434 A1* | 7/2007 | Watanabe | 257/758 |
| 2008/0050874 A1* | 2/2008 | Won et al. | 438/250 |
| 2008/0054328 A1* | 3/2008 | Wang | 257/306 |
| 2008/0054329 A1* | 3/2008 | Kim et al. | 257/306 |
| 2008/0064124 A1* | 3/2008 | Wang | 438/3 |
| 2008/0073685 A1* | 3/2008 | Wang | 257/295 |
| 2008/0182405 A1* | 7/2008 | Liu et al. | 438/623 |
| 2008/0203531 A1* | 8/2008 | Imai et al. | 257/535 |
| 2008/0206999 A1* | 8/2008 | Imada et al. | 438/694 |
| 2008/0217738 A1* | 9/2008 | Wang | 257/532 |
| 2008/0318378 A1* | 12/2008 | Wu et al. | 438/253 |
| 2009/0032953 A1* | 2/2009 | Kageyama | 257/751 |
| 2010/0007021 A1* | 1/2010 | Choo et al. | 257/751 |
| 2010/0087042 A1* | 4/2010 | Kim et al. | 438/396 |
| 2010/0221889 A1* | 9/2010 | Youn | 438/396 |
| 2010/0237313 A1* | 9/2010 | Mikawa et al. | 257/2 |
| 2010/0270677 A1* | 10/2010 | Usami | 257/773 |
| 2010/0283026 A1* | 11/2010 | Mikawa et al. | 257/2 |
| 2011/0001216 A1* | 1/2011 | Inoue | 257/532 |
| 2011/0121375 A1* | 5/2011 | Kawahara et al. | 257/296 |
| 2011/0284991 A1* | 11/2011 | Hijioka et al. | 257/532 |
| 2011/0291235 A1* | 12/2011 | Xiao et al. | 257/532 |
| 2012/0025285 A1* | 2/2012 | Choi | 257/296 |
| 2012/0025347 A1* | 2/2012 | Choi | 257/532 |
| 2012/0032299 A1* | 2/2012 | Wang | 257/532 |
| 2012/0193760 A1* | 8/2012 | Manabe et al. | 257/532 |
| 2012/0223412 A1* | 9/2012 | Baars et al. | 257/532 |
| 2012/0313218 A1* | 12/2012 | Fujimori et al. | 257/532 |
| 2013/0056850 A1* | 3/2013 | Kume et al. | 257/532 |
| 2013/0113075 A1* | 5/2013 | Feng et al. | 257/532 |
| 2013/0175666 A1* | 7/2013 | Tran et al. | 257/532 |
| 2013/0271938 A1* | 10/2013 | Lindert et al. | 361/782 |
| 2013/0285203 A1* | 10/2013 | Hiroi et al. | 257/532 |
| 2014/0042590 A1* | 2/2014 | Chen et al. | 257/532 |
| 2014/0144681 A1* | 5/2014 | Pushparaj et al. | 174/257 |
| 2015/0102461 A1* | 4/2015 | Lee | H01L 27/10814 257/532 |

OTHER PUBLICATIONS

Barth, A 45 nm SOI Embedded DRAM Macro for the POWER(TM) Processor 32 MByte On-Chip L3 Cache, Nov. 22, 2010.

Narasimha, 22nm High-Performance SOI Technology Featuring Dual-Embedded Stressors, Epi-Plate High-K Deep-Trench Embedded DRAM and Self-Aligned Via 15LM BEOL, Dec. 10, 2012.

Butt, A 0.039 square micrometer High Performance eDRAM Cell based on 32nm High-K/Metal SOI Technology, Dec. 6, 2010.

Crémer, COLK cell: A new embedded DRAM architecture for advanced CMOS nodes, Sep. 14, 2010.

Vernet, 32nm embedded DRAM reaching 400MHz and 0.1mm squared/Mb on a Low Cost and Low Power process, May 22, 2011.

\* cited by examiner

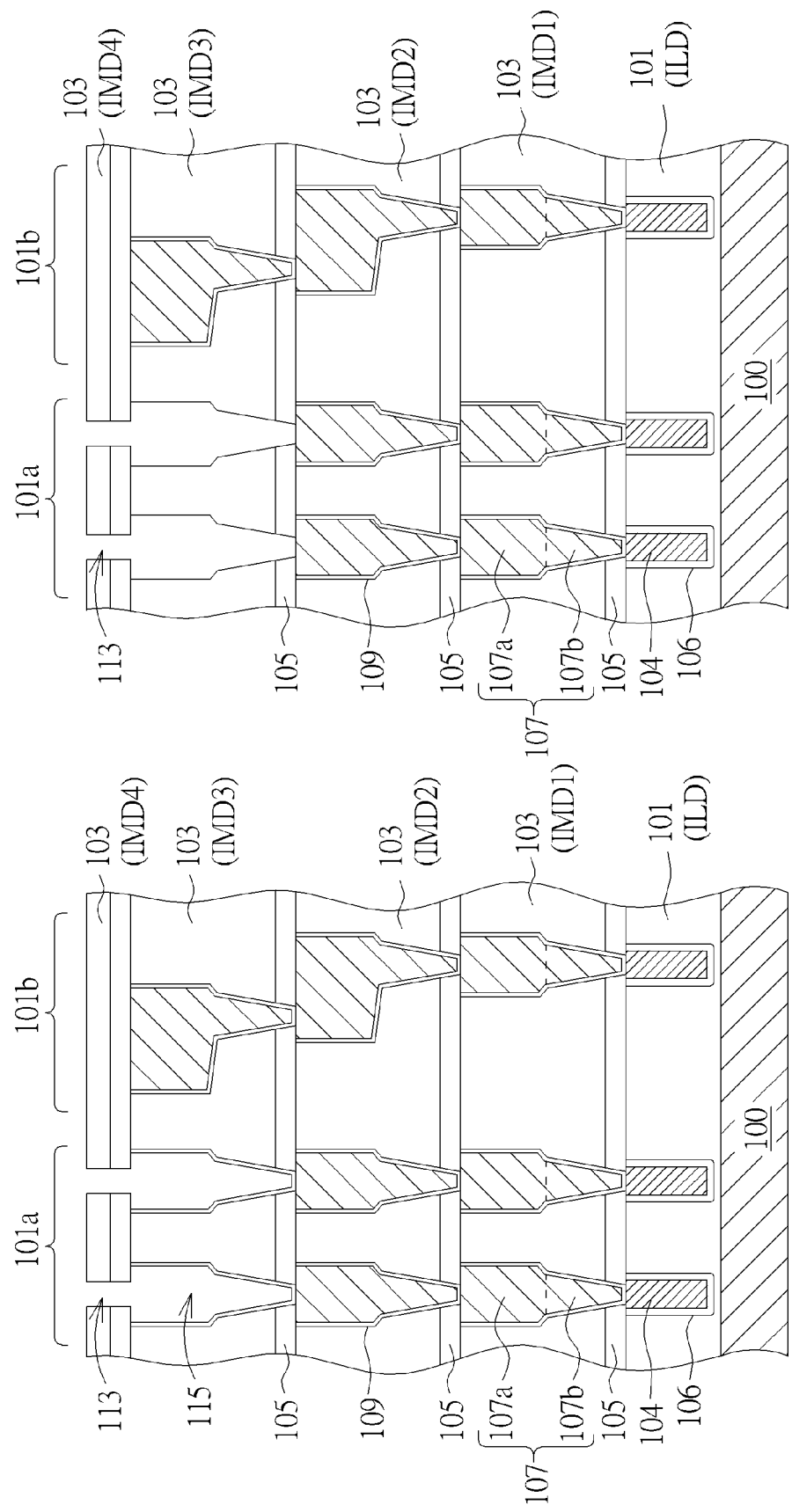

CAPACITOR STRUCTURE AND METHOD OF MANUFACTURING THE SAME

BACKGROUND OF THE INVENTION

1. Field of the Invention

The present invention generally relates to a capacitor structure, and more particularly, to a capacitor structure with interconnected dual damascene profiles made from preformed dual damascene structures and a method of manufacturing the same.

2. Description of the Prior Art

For several decades, the miniaturization of CMOS technology has been the most important technology requirements for increasing developing microprocessor performance and Dynamic Random Access Memories (DRAMs) density. Embedded DRAM (eDRAM), thanks to its native high integration density, allows bringing large memory volume close to computing cores and is widely used as a data buffer or cache at system-on-chip (SOC). With a 2× to 3× higher density than standard Static Random Access Memory (SRAM), it provides a competitive solution for many system design challenges: high performance computing, video processing, server applications, gaming, etc.

A DRAM generally includes an array of bit cells, each cell capable of storing a bit of information. A typical cell configuration consists of a capacitor for storing a charge (i.e., the bit of information) and an access transistor that provides access to the capacitor during read and write operations. The access transistor is connected between a bit line and the capacitor, and is gated (turned on or off) by a word line signal. During a read operation, the stored bit of information is read from the cell via the associated bit line. During a write operation, a bit of information is stored into the cell from the bit line via the transistor. The cells are dynamic in nature due to leakage, and therefore must be periodically refreshed.

Though DRAM is a competitive solution for system design, the performance of the high-density DRAM has not kept pace with the high-performance microprocessor speed, thereby hindering a system performance improvement. For example, with the migration of process node from 45 nm, 32 nm, 22 nm to even 16 nm node, the necessary capacity volume of the capacitor in DRAM cell must be kept to maintain the performance. The current approach in industry to keep the capacity volume of the capacitor is generally to: 1) increase the capacitor depth; 2) increase the dielectric k value (dielectric constant); or 3) thin down the dielectric thickness. Since the approaches 2) and 3) are susceptible to leakage issue, the best way to keeping capacity volume is by increasing the capacitor depth.

However, either for deep-trench type or stack type eDRAM, the depth of trench for accommodating the capacitor can not go deeper due to the physical limitation of etch process, thus it is difficult to keep the necessary capacity volume while the advanced process node keeps migrating and improving.

SUMMARY OF THE INVENTION

As above-explained, in order to increase the capacity volume of conventional eDRAM, an innovative process scheme for manufacturing the capacitor structure in stack configuration is provided in present invention. The novel process scheme of present invention uses an existing mature dual damascene process in the industry to form the capacitor trench, rather than using conventional dry etch process, thus the depth of capacitor trench can be significantly increased without being confined by the limitation of the etch process.

One object of the present invention is to provide a capacitor structure, comprising: a substrate with a plurality of dielectric layers sequentially formed thereon; a trench formed in said dielectric layers, wherein said trench is composed of at least two interconnected dual damascene recesses, each dual damascene recess formed in one said dielectric layer; and a capacitor multilayer disposed on the sidewall of said trench.

Another object of the present invention is to provide a method for manufacturing capacitor structures, comprising the steps of: providing a substrate with a plurality of dielectric layers sequentially disposed thereon and a plurality of interconnected dual damascene structures disposed in said dielectric layers; removing a number of said interconnected dual damascene structures to form a trench with at least two interconnected dual damascene recesses in said dielectric layers; and forming a capacitor multilayer on the sidewall of said trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 1-7 are cross-sectional views schematically illustrating a semiconductor process for manufacturing the capacitor structures in accordance with one embodiment of the present invention.

Figures 1, 2:
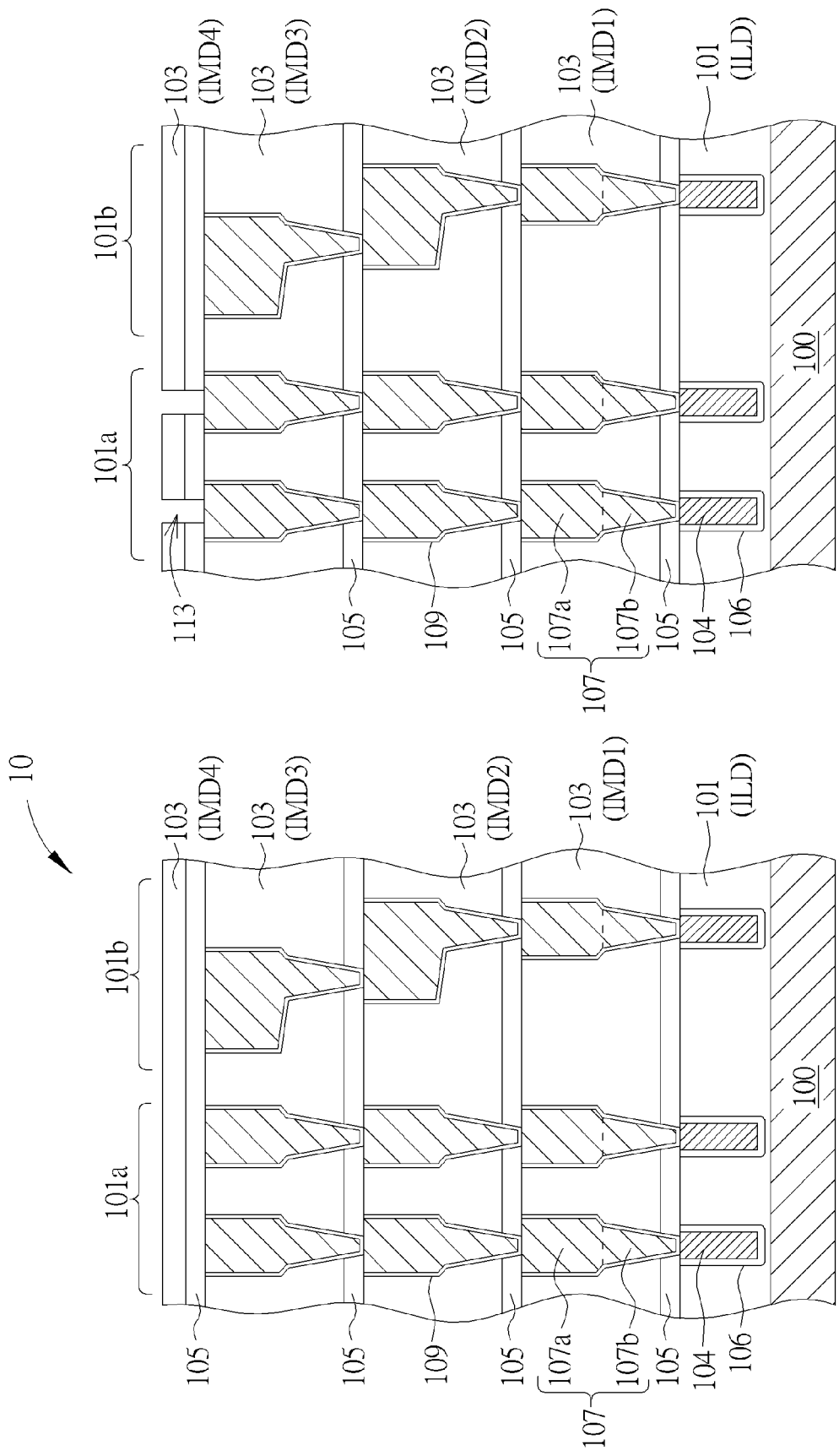

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer now to FIGS. 1-7, which are cross-sectional views schematically and sequentially illustrating a process flow for manufacturing capacitor structures in accordance with one embodiment of the present invention. Preliminary processing of the prepared substrate and various interconnect layers are not expressly shown, but will be apparent in light of this disclosure. Such processing can be implemented, for instance, using any number of conventional or custom fabrication techniques such as a dual damascene process as normally done in the industry. Numerous preliminary configurations will be apparent with the disclosed embodiment. The following embodiment will take eDRAM architecture as the demonstration. Please note that the capacitor design shown in this embodiment is not limited in eDRAM-based memory, it may also be used in SRAM-based memory architecture, or any other capacitor application in the integrated circuitry.

First, please refer to FIG. 1, which illustrates a stack-type eDRAM device 10 prior to formation of the capacitor structure. As shown in FIG. 1, this exemplary device 10 generally includes a bottommost substrate 100 with other semiconductor devices (not shown) formed thereon, such as an access transistor consisting of gate, source and drain. The substrate 101 is configured with various DRAM cell components integrated therein, such as access transistor and word line (not shown), and with a plurality of bit cells generally including a storage capacitor communicatively coupled to a bit line by way of an access transistor that is gated by a word line. In order to differentiate the DRAM area and logic area as well as to highlight the advantage that the process of present invention is compatible with the standard metal line logic process, the substrate 101 shown in FIG. 1 is divided into a memory area 101a and a logic area 101b. The substrate 101 may be, for example, a bulk semiconductor wafer (e.g., bulk silicon, germanium, gallium arsenide or other III-V materials, etc) or an on-insulator configuration (e.g., silicon on-insulator, germanium on-insulator, silicon germanium on-insulator, indium phosphide on-insulator, etc), with the characteristics of p-type, n-type, neutral-type, high or low resistivity, off-cut or not off-cut, etc. The device 100 in the embodiment of FIG. 1 could be, for example, a central processing unit or any other functional circuit having on-board eDRAM (e.g., purpose-built or field programmable integrated circuit). Note that electronics in the substrate are shown in abstract schematic form to simplify the discussion where appropriate.

Refer again to FIG. 1, a plurality of dielectric layers and stacked interconnect structures are formed on the substrate 100. To describe in further details, in this exemplary embodiment, an interlayer dielectric layer (ILD) 101 is covered on the substrate 100, and three stacked dielectric layers, such as interconnect layer (ICD) or inter-metal layer (IMD) 103 are subsequently formed on the ILD layer 101. The stack dielectric layer 103 is denoted as IMD1-IMD3 for clarity in the figure, wherein each IMD layer 103 is effectively isolated or otherwise demarcated from a cap layer 105 served as an etch stop layer. The dielectric layer 103 may include any number of conventional dielectric materials commonly used in integrated circuit applications, such as oxides (e.g., silicon dioxide, carbon doped oxide), silicon nitride, or organic polymers (e.g., perfluorocyclobutane or polytetrafluoroethylene), fluorosilicate glass, and organosilicates (e.g., silsesquioxane, siloxane, or organosilicate glass). The dielectric material may be low-k or high-k depending on the desired isolation, and may include pores or other voids to further reduce its dielectric constant.

Furthermore, a plurality of interconnect structures 107 (implemented as a dual damascene configuration) are formed within each dielectric layer 103. Each interconnect structure 107 includes an upper metal line 107a (ex. M1, M2, M3) and lower corresponding vias 107b (ex. V0, V1, V2) to constitute a dual damascene structure. The upper and lower interconnect structures 107 in adjacent dielectric layers 103 may interconnect each other to form a complete circuitry. The dual damascene interconnect structures 107 can be formed in the dielectric layer IMD1-IMD3, for example, by using standard lithography including via and trench patterning and subsequent etch processes followed by polishing, cleans, etc, as typically done in a conventional dual damascene process. Redundant description is, therefore, omitted herein for the simplicity. The via portion 107b of the lowest interconnect structures 107 in dielectric layer IMD1 is connected with a contact plug 104 formed in the ILD layer 101. The contact plug 104 may be, for example, further connected to an access transistor (not shown) on the substrate 100. A barrier layer 106 may be formed surrounding the contact plug 104. The access transistor may include a word line to gate the connection between a bit line (not shown) and the interconnect structures 107. For simplicity, the trivial features will not be shown in the figures. As previously explained, please note that the layout shown is not intended to implicate any particular feature spacing or density. Rather, this layout is simply an arbitrary example, and any number of other layout designs can benefit from an embodiment of the present invention.

In addition, as shown in FIG. 1, each interconnect structure 107 in this exemplary embodiment is configured with a barrier layer 109 conformally formed therearound to prevent the interconnect metal or seed material from diffusing into the surrounding interconnect IMD layer 103. The barrier layer 109 can be, for example, tantalum (Ta), tantalum nitride (TaN), titanium (Ti), titanium nitride (TiN), or combinations thereof deposited using chemical vapor deposition (CVD) or atomic layer deposition (ALD), or other suitable deposition technique, to provide a continuous and conformal barrier layer.

Refer now to FIG. 2, after the substrate with interconnected dual damascene structures 107 is prepared, an opening 113 is formed on each topmost dual damascene structure 107 within the memory area 101a by using standard lithography including patterning and subsequent etch process to open up the topmost dielectric layers (IMD4) 103 and cap layer 105. The opening 113 may expose the metal line portion 107a of the dual damascene structure 107 within the memory area 101a, while the dual damascene structures 107 in logic area 101b are not exposed, thus the dual damascene structures 107 served as the logic metal lines in the logic area 101b won't be subject to the following etch process for forming the capacitor trench.

Refer now to FIG. 3, after the openings 113 are formed, a wet etch process is performed via the openings 113 to remove the topmost dual damascene structures 107 within the memory area 101a. As well-known in the industry, a typical interconnect metal used for implementing the likes of landing pads, lines, and vias in dual damascene scheme is copper (Cu). However, any other suitable interconnect metal or alloy can be used, such as aluminum (Al), if so desired. Typical solutions for wet etching of Cu interconnect metals may use acids or chelators that dissolve metal indiscriminately along grain boundaries and exposed surfaces. In accordance with an embodiment of the present invention, the interconnect metal Cu is removed with a wet etch process that uses an etchant consisting of $H_2SO_4/H_2O_2/H_2O$ based chemical. The $H_2SO_4/H_2O_2/H_2O$ based chemical, ex. in the combination ratio of 1:4:10 at temperature about 60° C., can achieve high Cu to Ta/TaN/oxide/W selectivity, thus the copper dual damascene structure 107 can be effectively removed without damaging the surrounding IMD layer 103, cap layer 105 and barrier layer 109, and the Ta/TaN based barrier layer 109 may still remain on the sidewall of dual damascene trench, as shown in FIG. 3, thereby forming a dual damascene recess 115 with Ta/TaN barrier sidewall.

Furthermore, please refer now to FIG. 4, the remaining Ta/TaN based barrier layer 109 on the sidewall of dual damascene recess 115 may be optionally removed by additional wet etch process using different chemicals, such as NH$_4$OH/H$_2$O$_2$/H$_2$O based chemical in the combination ratio of 1:1.1:5 at temperature about 60° C., without damaging the surrounding IMD layer 103, cap layer 105 and the interconnected dual damascene structure 107 connected thereunder. The removal of barrier layer 109 is a key feature of the present invention because the configuration of sequentially interconnected dual damascene structures 107 with conformal barrier layers 109 provides the possibility for the present invention to scale the depth of the desired capacitor trench by using the standard, mature wet etch process.

Figure 5:
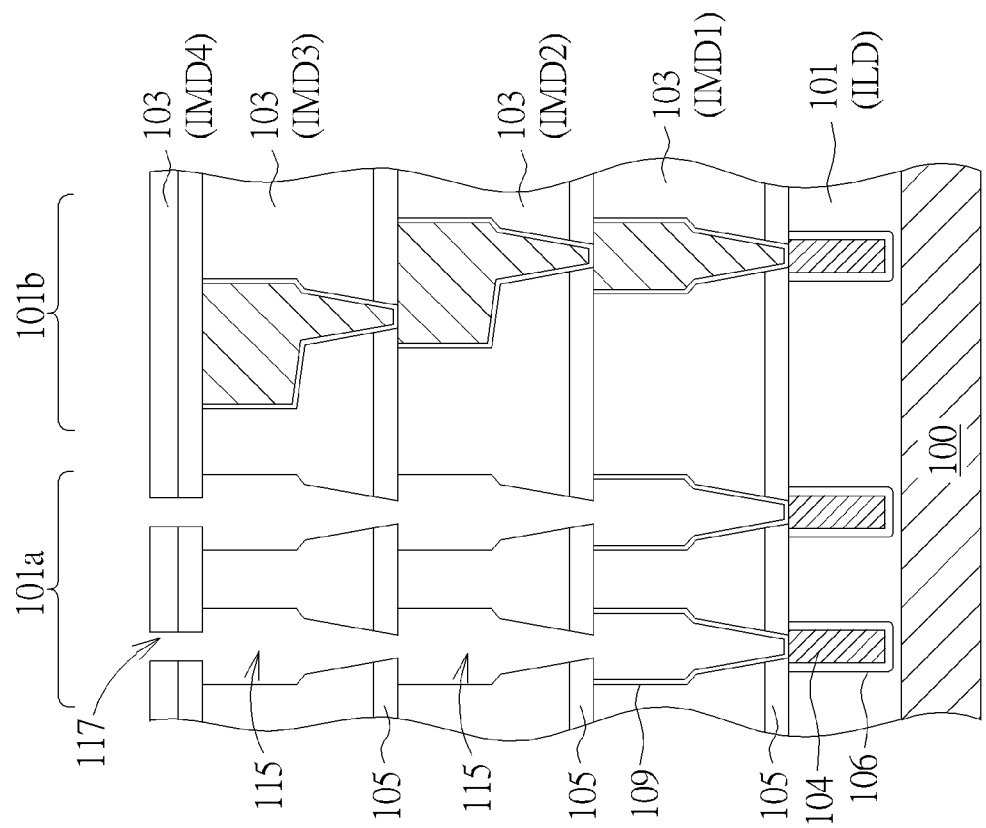

For example, please refer now to FIG. 5, if predetermined trench depth of the capacitor structure is designed to extend from IMD3 to IMD1 in order to achieve desired capacitor volume, the barrier layer 109 in the IMD3 layer may be removed to expose the dual damascene structures 107 thereunder. In this concept, by repeating the wet etching process shown in the above embodiment, the dual damascene structures 107 in the lower IMD2 and IMD1 layer can be subsequently removed, thereby forming a deep trench 117 constituted by three continuous and interconnected dual damascene recesses 115 and having corresponding trench profile through the dielectric layer IMD3~IMD1. Please note that in this embodiment, the barrier layer 109 in the lowest IMD1 layer remains on the sidewall of the trench.

Figure 6:
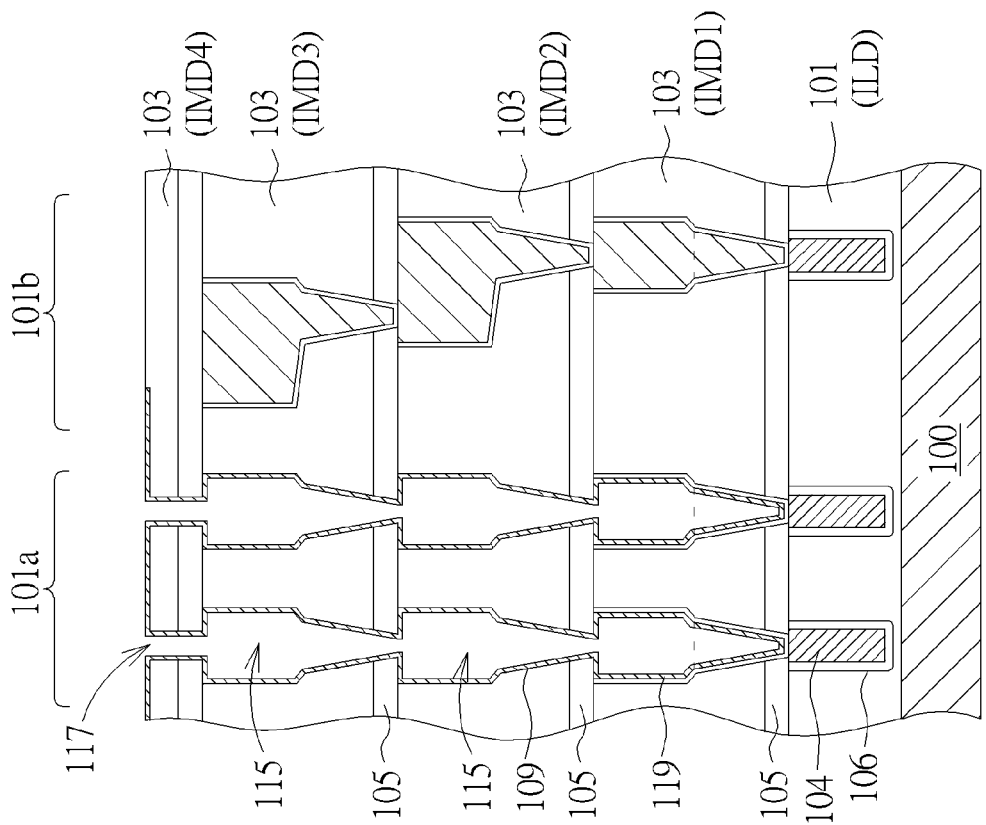

Please refer now to FIG. 6, after the trench 117 including several interconnected dual damascene recesses 115 is formed, a capacitor multilayer 119 is conformally deposited on the sidewall of the trench 117. The capacitor multilayer 119 generally includes a metal-insulator-metal (MIM) capacitor configuration, such as TiN/HfO$_2$/TiN multilayer formed by ALD process, although any suitable conductor-insulator-configuration can be used in accordance with an embodiment of the present invention. As shown in FIG. 6, a portion of the capacitor multilayer 119 is extended on the topmost dielectric layer IMD4 outward the trench 117. The outwardly extended portion of the capacitor multilayer 119 may be used to electrically connect with other component of the capacitor structure. Please note that in this embodiment, the capacitor multilayer 119 is conformally formed on the sidewall of the entire trench 117, rather than filling up the trench 117. The dual damascene recess 115 still exists after the capacitor multilayer 119 is deposited.

The insulator in the capacitor multilayer 119 is typically implemented with a high-k dielectric (to reduce capacitance loss when scaling down capacitor area), but in a more general sense, any dielectric material appropriate for the given application can be used (including dielectric materials such as silicon dioxide and silicon nitride). Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, additional processing may be performed on the high-k dielectric layer, such as an annealing process to improve the quality of the high-k material.

The top and bottom metal electrodes in the capacitor multilayer 119 can be implemented, for example, with any suitable metal or silicon containing layers. In some example embodiments, the top and/or bottom electrodes may include aluminum, carbon, chromium, cobalt, hafnium, iridium, molybdenum, niobium, platinum, ruthenium, poly-silicon, tantalum, titanium, tungsten, vanadium, zirconium, and combinations and/or nitrides or oxides thereof (e.g., iridium oxide, ruthenium oxide, tantalum carbide, tantalum aluminum carbide, tantalum nitride, tantalum aluminum nitride, titanium carbide, titanium nitride, titanium aluminum nitride, and tungsten nitride, to name a few). In addition, and in accordance with some embodiments, note that one or both of the top and bottom electrodes can be a laminated structure or otherwise formed from a plurality of layers (having the same or different materials). Further note that the bottom electrode material and/or configuration may be different from the top electrode material and/or configuration. Any number of conventional or custom electrode configurations can be used in accordance with an embodiment of the present invention, as will be appreciated.

Figure 7:
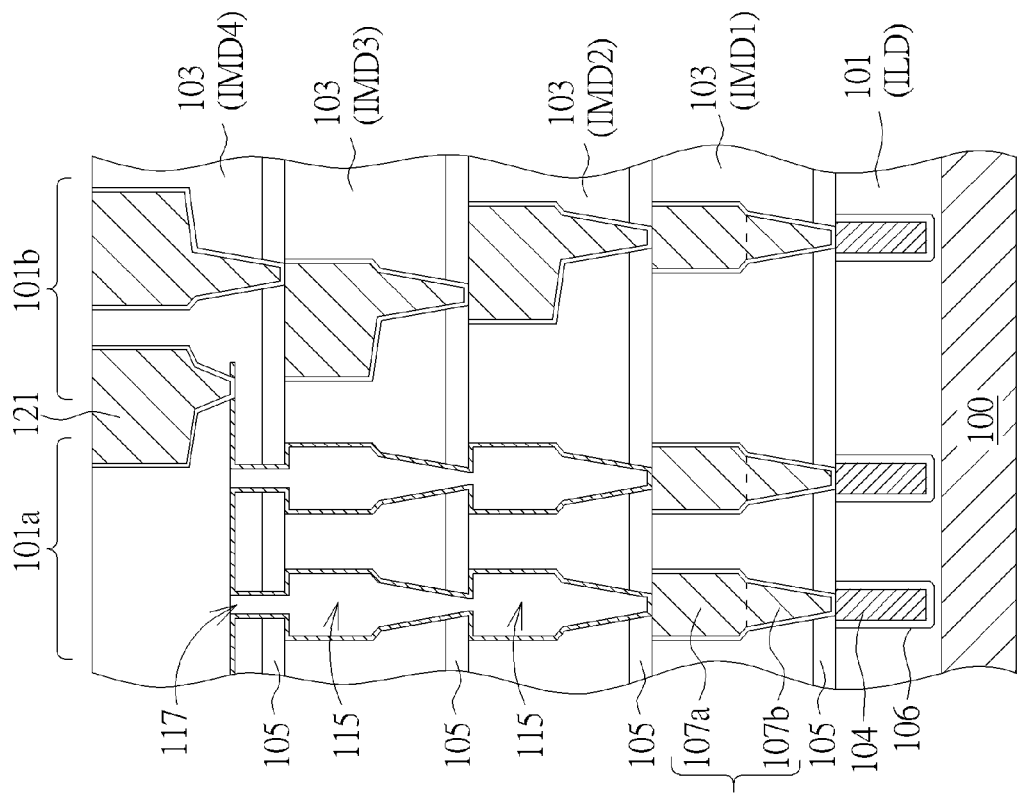

Please refer now to FIG. 7, which illustrates the capacitor structure after the capacitor multilayer 119 is formed. Another dual damascene structure 121 may be formed in the IMD4 layer to connect the capacitor multilayer 119. In the embodiment, the dual damascene structure 121 may be a portion of the metal line in the circuitry. Alternatively, in some embodiment, the dual damascene structure 121 may be a bit line disposed above and connect the entire capacitor structure if the device is a capacitor-under-bitline (CUB)-based DRAM.

Figure 8:
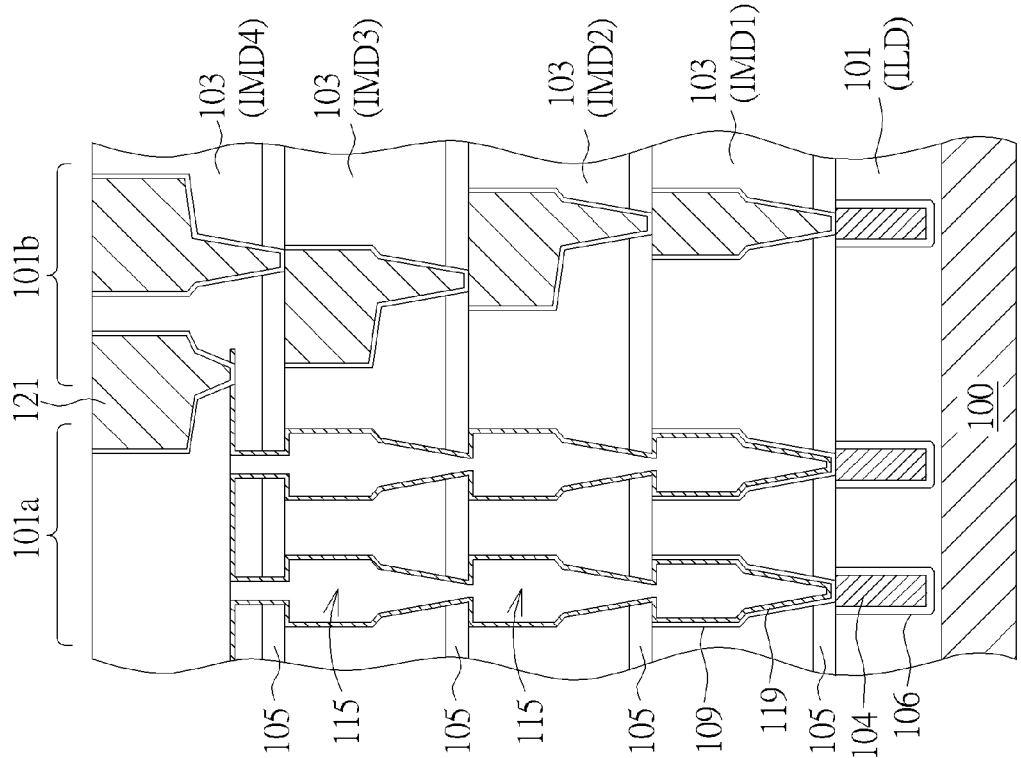
FIG. 8 is a cross-sectional view schematically illustrating a capacitor structures in accordance with another embodiment of the present invention.

FIG. 8 is a cross-sectional view schematically illustrating a capacitor structures in accordance with another embodiment of the present invention. In FIG. 8, the capacitor trench 117 only extends from IMD3 to IMD2 and left no remaining barrier layer 109. This embodiment is demonstrated to show that the depth of the capacitor structure in present invention may be customized or adjusted through removing predetermined number of the dual damascene structure 121 in the IMD layer, and may or may not include the barrier layer 109.

As will be appreciated in light of this disclosure, the capacitor can span one or more metal layers of a given structure, where each layer generally includes metal lines and/or vias for electrically connecting one layer to the next and/or to various electronic circuitry otherwise integrated into the overall structure. Thus, eDRAM capacitors can be integrated, for instance, into a back-end logic fabrication process for a processor (or other functional circuit) where the capacitors and various interconnect features (e.g., metal logic lines and vias, etc) share the same layers. By spanning the capacitor over multiple layers, greater capacitance levels can be achieved. The larger the capacitance of a given eDRAM cell, the greater the charge that can be stored by that cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   a substrate with a plurality of dielectric layers sequentially formed thereon;
   a trench formed in said dielectric layers, wherein said trench is composed of at least two interconnected dual damascene recesses, said at least two interconnected dual damascene recesses comprise empty spaces or hollow voids, and each dual damascene recess formed in one said dielectric layer; and
   a capacitor multilayer disposed on the sidewall of said trench and also between the dielectric layers and the dual damascene recesses, wherein the empty spaces or hollow voids are completely enclosed.

2. The capacitor structure according to claim 1, wherein said capacitor multilayer comprises metal/insulator/metal tri-layers.

3. The capacitor structure according to claim 2, wherein said capacitor multilayer comprises TiN/HfO$_2$/TiN tri-layers.

4. The capacitor structure according to claim 1, further comprising a barrier layer disposed between the sidewall of a lowest said dielectric layer and said capacitor multilayer.

5. The capacitor structure according to claim 4, wherein the material of said barrier layer comprises Ta/TaN.

6. The capacitor structure according to claim 1, further comprising a dual damascene structure connected under said capacitor structure.

7. The capacitor structure according to claim 6, wherein the material of said dual damascene structure comprises Cu.

8. The capacitor structure according to claim 1, further comprising a contact plug connected under said capacitor structure.

9. The capacitor structure according to claim 8, wherein the material of said contact plug comprises W.

10. The capacitor structure according to claim 1, further comprising a dual damascene structure connected on said capacitor structure.

11. The capacitor structure according to claim 10, wherein said dual damascene structure is a dual damascene structure comprising Cu or Al.

12. The capacitor structure according to claim 1, further comprising an oxide cap disposed between each said dielectric layer.

* * * * *